(12) United States Patent
Todorow et al.

(10) Patent No.: US 8,349,128 B2
(45) Date of Patent: *Jan. 8, 2013

(54) METHOD AND APPARATUS FOR STABLE PLASMA PROCESSING

(75) Inventors: Valentin N. Todorow, Palo Alto, CA (US); John P. Holland, San Jose, CA (US); Michael D. Willwerth, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1363 days.

This patent is subject to a terminal disclaimer.

(21) Appl. No.: 10/880,754

(22) Filed: Jun. 30, 2004

(65) Prior Publication Data

US 2006/0000805 A1 Jan. 5, 2006

(51) Int. Cl.
 C23C 16/00 (2006.01)
 C23F 1/00 (2006.01)
 H01L 21/306 (2006.01)

(52) U.S. Cl. ........ 156/345.48; 156/345.35; 156/345.51; 156/345.52; 156/345.53; 156/345.54; 156/345.55; 118/723 E; 118/723 ER; 118/723 I; 118/723 IR; 118/723 ME; 118/723 MR; 118/728; 118/729; 118/730

(58) Field of Classification Search ............ 156/345.33, 156/345.34, 345.48, 345.43–345.47, 345.49, 156/345.51–345.55, 915; 118/723 ER, 723 ME, 118/723 IR, 723 I, 723 E, 723 MR, 728–730; 216/67, 68

See application file for complete search history.

(56) References Cited

U.S. PATENT DOCUMENTS

| | | | |
|---|---|---|---|
| 4,496,420 A | 1/1985 | Frohlich et al. | |
| 4,600,464 A | 7/1986 | Desilets et al. | |
| 5,024,748 A | 6/1991 | Fujimura | |
| 5,075,256 A * | 12/1991 | Wang et al. | 438/716 |
| 5,556,500 A | 9/1996 | Hasegawa et al. | |
| 5,593,540 A | 1/1997 | Tomita et al. | |
| 5,605,637 A | 2/1997 | Shan et al. | |
| 5,614,026 A * | 3/1997 | Williams | 118/723 ME |
| 5,673,922 A | 10/1997 | Sherstinsky et al. | |
| 5,972,781 A | 10/1999 | Wegleiter et al. | |
| 6,129,808 A | 10/2000 | Wicker et al. | |
| 6,167,835 B1 | 1/2001 | Ootera et al. | |
| 6,190,496 B1 * | 2/2001 | DeOrnellas et al. | 156/345.44 |

(Continued)

FOREIGN PATENT DOCUMENTS

EP 0 488 393 A2 6/1992

(Continued)

OTHER PUBLICATIONS

Search Report for Taiwan Patent Application No. 094120494, dated Mar. 11, 2007.

(Continued)

*Primary Examiner* — Rakesh Dhingra

(74) *Attorney, Agent, or Firm* — Patterson & Sheridan, LLP

(57) ABSTRACT

A method and apparatus for etching a substrate using a spatially modified plasma is provided herein. In one embodiment, the method includes providing a process chamber having a plasma stabilizer disposed above a substrate support pedestal. A substrate is placed upon the pedestal. A process gas is introduced into the process chamber and a plasma is formed from the process gas. The substrate is etched with a plasma having an ion density to radical density ratio defined by the plasma stabilizer.

27 Claims, 3 Drawing Sheets

U.S. PATENT DOCUMENTS

| | | | |
|---|---|---|---|
| 6,203,657 | B1 | 3/2001 | Collison et al. |
| 6,261,406 | B1 | 7/2001 | Jurgensen et al. |
| 6,270,687 | B1 | 8/2001 | Ye et al. |
| 6,287,643 | B1 | 9/2001 | Powell et al. |
| 6,290,806 | B1 | 9/2001 | Donohoe |
| 6,299,689 | B1 | 10/2001 | Wang et al. |
| 6,306,244 | B1 | 10/2001 | Kennedy et al. |
| 6,335,293 | B1 | 1/2002 | Luo et al. |
| 6,339,206 | B1 | 1/2002 | Johnson |
| 6,364,949 | B1 | 4/2002 | Or et al. |
| 6,375,748 | B1 | 4/2002 | Yudovsky et al. |
| 6,514,378 | B1 * | 2/2003 | Ni et al. .......... 438/710 |
| 6,551,447 | B1 | 4/2003 | Savas et al. |
| 6,553,332 | B2 | 4/2003 | Leng |
| 6,589,352 | B1 | 7/2003 | Yudovsky et al. |
| 6,656,322 | B2 | 12/2003 | Hongo et al. |
| 6,676,800 | B1 | 1/2004 | Festa et al. |
| 6,676,803 | B2 | 1/2004 | Kim |
| 6,692,649 | B2 | 2/2004 | Collison et al. |
| 6,782,843 | B2 | 8/2004 | Kinnard et al. |
| 6,805,779 | B2 | 10/2004 | Chistyakov |
| 6,806,651 | B1 | 10/2004 | Chistyakov |
| 6,806,949 | B2 | 10/2004 | Ludviksson et al. |
| 6,837,966 | B2 | 1/2005 | Nishimoto et al. |
| 6,868,800 | B2 | 3/2005 | Moroz |
| 6,872,259 | B2 | 3/2005 | Strang |
| 6,926,802 | B2 | 8/2005 | Lee |
| 6,949,165 | B2 | 9/2005 | Koshimizu |
| 7,037,846 | B2 | 5/2006 | Srivastava et al. |
| 7,241,345 | B2 | 7/2007 | Ramamurthy et al. |
| 2002/0033233 | A1 | 3/2002 | Savas |
| 2002/0121501 | A1 | 9/2002 | Choquette et al. |
| 2002/0142612 | A1 * | 10/2002 | Wu et al. .......... 438/710 |
| 2002/0185229 | A1 * | 12/2002 | Brcka et al. .......... 156/345.48 |
| 2002/0189762 | A1 | 12/2002 | Kim |
| 2003/0010448 | A1 | 1/2003 | Lee |
| 2003/0019580 | A1 | 1/2003 | Strang |
| 2003/0047536 | A1 * | 3/2003 | Johnson .......... 216/67 |
| 2003/0094643 | A1 | 5/2003 | Yang |
| 2003/0194510 | A1 | 10/2003 | Nguyen et al. |
| 2003/0209324 | A1 | 11/2003 | Fink |
| 2003/0217812 | A1 | 11/2003 | Yoshiki et al. |
| 2004/0000535 | A1 | 1/2004 | Mueller et al. |
| 2004/0003780 | A1 | 1/2004 | Yudovsky et al. |
| 2004/0031565 | A1 * | 2/2004 | Su et al. .......... 156/345.33 |
| 2004/0035532 | A1 * | 2/2004 | Jung .......... 156/345.43 |
| 2004/0069227 | A1 | 4/2004 | Ku et al. |
| 2004/0079725 | A1 | 4/2004 | Inomata et al. |
| 2004/0083975 | A1 | 5/2004 | Tong et al. |
| 2004/0129226 | A1 | 7/2004 | Strang et al. |
| 2004/0192043 | A1 | 9/2004 | Makita et al. |
| 2004/0212312 | A1 | 10/2004 | Chistyakov |
| 2004/0219737 | A1 * | 11/2004 | Quon .......... 438/222 |
| 2004/0250772 | A1 | 12/2004 | Ramamurthy et al. |
| 2004/0261718 | A1 | 12/2004 | Kim et al. |
| 2005/0006344 | A1 | 1/2005 | Tanaka |
| 2005/0011447 | A1 | 1/2005 | Fink |
| 2005/0066902 | A1 | 3/2005 | Fink |
| 2005/0087302 | A1 * | 4/2005 | Mardian et al. .......... 156/345.33 |
| 2005/0133164 | A1 | 6/2005 | Fischer et al. |
| 2005/0139317 | A1 | 6/2005 | Wu et al. |
| 2005/0241583 | A1 | 11/2005 | Buechel et al. |
| 2005/0241767 | A1 | 11/2005 | Ferris et al. |
| 2006/0000802 | A1 | 1/2006 | Kumar et al. |
| 2006/0000805 | A1 | 1/2006 | Todorow et al. |
| 2006/0060303 | A1 | 3/2006 | Fink et al. |
| 2006/0213865 | A1 | 9/2006 | Honda et al. |
| 2006/0260747 | A1 | 11/2006 | Hirose et al. |
| 2007/0000614 | A1 | 1/2007 | Hatamura et al. |
| 2007/0015504 | A1 | 1/2007 | Kusuda et al. |
| 2007/0017898 | A1 | 1/2007 | Kumar et al. |
| 2007/0044719 | A1 | 3/2007 | Ku et al. |
| 2008/0072823 | A1 | 3/2008 | Yudovsky et al. |
| 2008/0099426 | A1 | 5/2008 | Kumar et al. |
| 2008/0099431 | A1 | 5/2008 | Kumar et al. |
| 2008/0101978 | A1 | 5/2008 | Ryabova et al. |

FOREIGN PATENT DOCUMENTS

| | | |
|---|---|---|
| EP | 0 496 564 A1 | 7/1992 |
| EP | 0 522 296 A2 | 1/1993 |
| EP | 612840 A2 | 8/1994 |
| EP | 702392 A2 | 3/1996 |
| EP | 0930642 | 7/1999 |
| EP | 1024520 | 8/2000 |
| EP | 1 355 342 A2 | 10/2003 |
| EP | 1 686 421 A2 | 8/2006 |
| JP | 62299031 | 12/1967 |
| JP | 02-184029 | 7/1990 |
| JP | 08-148473 | 6/1996 |
| JP | 9115836 | 5/1997 |
| JP | 11067727 | 3/1999 |
| JP | 2004165298 | 6/2004 |
| KR | 1020010039233 A | 5/2001 |
| KR | 2004-13170 | 2/2004 |
| KR | 2005-0067405 A | 7/2005 |
| KR | 2006-45765 | 5/2006 |
| KR | 2006-0048674 A | 5/2006 |
| TW | 502290 | 9/2002 |
| WO | WO 98/50600 | 11/1998 |
| WO | WO-015504 A1 | 1/2001 |
| WO | WO 03 036704 A1 | 5/2003 |
| WO | WO 03/054912 * | 7/2003 |

OTHER PUBLICATIONS

Office Action for Korean Patent Application No. 10-2005-0031466, dated Oct. 31, 2007.
Office Action for Korean Patent Application No. 10-2005-0056803, dated Nov. 23, 2007.
Office Action for Chinese Patent Application No. 200510079835.1, dated Aug. 3, 2007.
Office Action for U.S. Appl. No. 10/882,084 dated Nov. 1, 2007.
EP Search Report, Application No. EP 05 25 2818 dated Jun. 27, 2007.
Non-Final Office Action dated Dec. 29, 2006 for U.S. Appl. No. 10/882,084.
Final Office Action dated Jun. 5, 2007 for U.S. Appl. No. 10/882,084.
Response to Final Office Action dated Jun. 5, 2007 for U.S. Appl. No. 10/882,084.
Taiwan Notice of Allowance dated Aug. 14, 2007 for Application No. 94120494.
Response to Office Action for Chinese Patent Application No. 200510079835.1 dated Nov. 30, 2007.
Response to Office Action dated Dec. 29, 2006 for U.S. Appl. No. 10/882,084.
Response to Office Action of Nov. 1, 2007 for U.S. Appl. No. 10/882,084, filed Feb. 26, 2008.
Final Office Action for U.S. Appl. No. 10/882,084 dated May 28, 2008.
Response to Final Office Action of May 28, 2008 for U.S. Appl. No. 10/882,084, filed on Jul. 28, 2008.
Declaration under 37 C.F.R. §1.132 for U.S. Appl. No. 10/882,084, filed Jul. 29, 2008.
Advisory Action for U.S. Appl. No. 10/882,084 dated Aug. 11, 2008.
Office Action from Korean Intellectual Property Office dated Dec. 23, 2008 for corresponding Korean Patent application No. 10-2005-0031466, including Concise Statement of Relevance.
Office Action dated Jun. 8, 2009, in Korean Application 10-2005-0031466.
Notice of Reasons for Rejection issued Jan. 5, 2010 in Japanese Application No. 2005-163780.
Prosecution history of U.S. Appl. No. 10/882,084, as of Sep. 7, 2010.
Prosecution history of U.S. Appl. No. 11/530,659, as of Sep. 7, 2010.
Prosecution history of U.S. Appl. No. 11/554,495, as of Sep. 7, 2010.
Prosecution history of U.S. Appl. No. 11/554,502, as of Sep. 7, 2010.
Official Letter dated Sep. 1, 2010, from Taiwan Patent Office for corresponding Taiwan Patent Application No. 95146522.
Official Letter dated Aug. 9, 2010, from Taiwan Patent Office for corresponding Taiwan Patent Application No. 95146522.

* cited by examiner

METHOD AND APPARATUS FOR STABLE PLASMA PROCESSING

CROSS-REFERENCE TO RELATED APPLICATIONS

The subject matter of this application is related to the subject matter disclosed in U.S. patent application Ser. No. 13/045,239, entitled "METHOD AND APPARATUS FOR PHOTOMASK PLASMA ETCHING", filed on Mar. 10, 2011, by Kumar, et al. (ATTORNEY DOCKET NUMBER 9400), which is hereby incorporated herein by reference in its entirety.

BACKGROUND OF THE INVENTION

1. Field of the Invention

Embodiments of the present invention generally relate to a method and apparatus for plasma processing of a substrate and, more specifically, to a method and apparatus for etching a substrate using a stable plasma.

2. Description of the Related Art

Integrated circuits have evolved into complex devices that can include millions of transistors, capacitors and resistors on a single chip. The evolution of chip designs continually requires faster circuitry and greater circuit density. Circuit density has a pronounce importance as the speed and number of functions a circuit can execute increases along with the density of the circuit structure. Some design attributes affecting the speed and circuit density of integrated circuits include the resistance and thickness of the materials used to form the layer comprising the circuit structure formed on a substrate.

Metallic materials are used to create wireline interconnects, vias, electrodes, and the like. The metal structures are key to the functionality of an integrated circuit. One metal that is frequently used to fabricate circuit structures is tungsten. Tungsten may be accurately deposited using conventional Chemical Vapor Deposition (CVD) methods and generally has a low resistivity. Circuit designers have found tungsten to be a favorable material for use proximate polysilicon as tungsten exhibits good resistance to permeation by polysilicon, which enables tungsten to retain its physical properties over the course of substrate processing and device use.

In order to maximize circuit density, the layers comprising the circuit structure, including those comprising tungsten, must be minimized. However, when processing such thin layers, care must be taken to avoid damaging the layers during processing. Damaged layers result in defective circuit structures and increased substrate rejects.

One process that can easily damage thin layers is etching. Fluorinated chemistry is typically employed to remove exposed tungsten and other metals. A plasma is utilized to enhance the etch process. However, it is difficult to maintain a stable plasma. One method for increasing plasma stability is to increase the power supplied to the chamber. Another method is to decrease the gap between the substrate being etched and the top of the chamber. Unfortunately, both increasing the power and decreasing the gap lead to an increase in ion bombardment of the substrate, which may seriously damage the circuits being formed on the substrate.

Therefore, there is a need in the art for an improved method and apparatus for etching metals, especially tungsten.

SUMMARY OF THE INVENTION

The present invention generally provides a method and apparatus for etching a substrate using a spatially modified plasma. In one embodiment, the method includes providing a process chamber having a plasma stabilizer disposed above a substrate support pedestal. A substrate is placed upon the pedestal. A process gas is introduced into the process chamber and a quasi-remote plasma is formed from the process gas. The substrate is etched with a plasma having an ion density to radical density ratio defined by the plasma stabilizer.

In another embodiment of the invention, an apparatus is provided for etching a substrate with a spatially modified plasma. The apparatus includes a process chamber having a substrate support pedestal disposed therein. An RF power source is provided for forming a plasma within the chamber. A plasma stabilizer is disposed in the chamber above the pedestal. The plasma stabilizer controls the spatial distribution of charged and neutral species of the plasma. The plasma stabilizer includes a substantially flat member electrically isolated from the chamber. The member has a plurality of apertures formed therethrough.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides a method and apparatus for improved etching processes. The apparatus includes a plasma stabilizer disposed in a plasma processing chamber. The plasma stabilizer controls the spatial distribution of the charged and neutral species in the chamber during processing such that a dense, stable plasma may be formed in an upper processing region of the chamber (above the plasma stabilizer) and a plasma with controlled characteristics in a lower processing region (between the plasma stabilizer and a substrate disposed on a substrate support pedestal).

Figure 1:
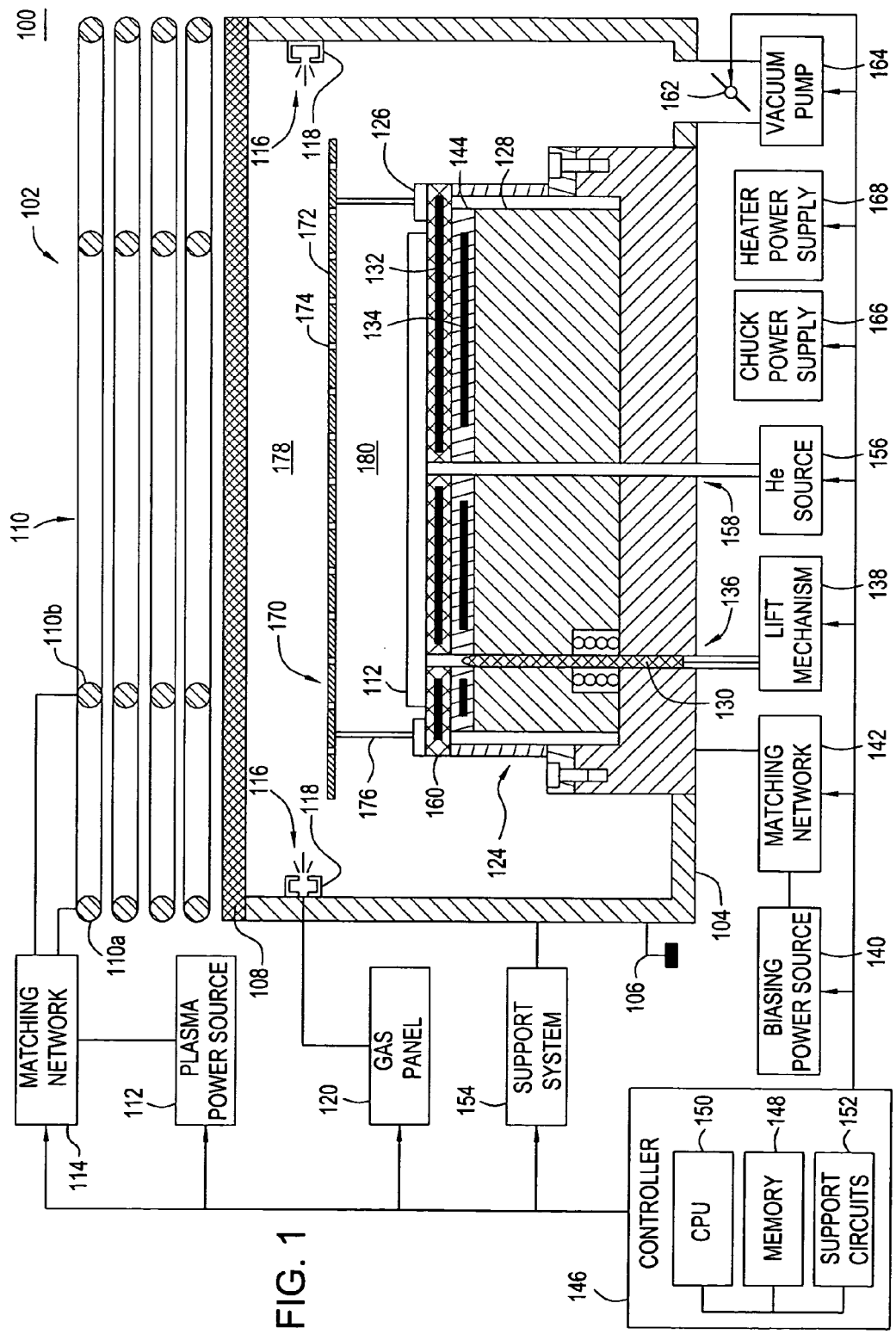
FIG. 1 is a schematic diagram of an etch reactor having a plasma stabilizer.

FIG. 1 depicts a schematic diagram of an etch reactor 100 having a plasma stabilizer 170. Suitable reactors that may be adapted for use with the teachings disclosed herein include, for example, the Decoupled Plasma Source (DPS®) I and DPS® II reactors, all of which are available from Applied Materials, Inc. of Santa Clara, Calif. The DPS® I and DPS® II reactors may also be used as processing modules of a Centura® integrated semiconductor wafer processing system, also available from Applied Materials, Inc. The particular embodiment of the reactor 100 shown herein is provided for illustrative purposes and should not be used to limit the scope of the invention.

The reactor 100 generally comprises a process chamber 102 having a substrate pedestal 124 within a conductive body (wall) 104, and a controller 146. The chamber 102 has a substantially flat dielectric ceiling 108. Other modifications of the chamber 102 may have other types of ceilings, e.g., a dome-shaped ceiling. An antenna 110 is disposed above the ceiling 108. The antenna 110 comprises one or more inductive coil elements that may be selectively controlled (two co-axial elements 110a and 110b are shown in FIG. 1). The antenna 110 is coupled through a first matching network 114 to a plasma power source 112. The plasma power source 112 is typically capable of producing up to about 3000 W at a tunable frequency in a range from about 50 kHz to about 13.56 MHz.

The substrate pedestal (cathode) 124 is coupled through a second matching network 142 to a biasing power source 140. The biasing source 140 generally is a source of up to about 500 W at a frequency of approximately 13.56 MHz that is capable of producing either continuous or pulsed power. Alternatively, the source 140 may be a DC or pulsed DC source.

In one embodiment, the substrate support pedestal 124 comprises an electrostatic chuck 160. The electrostatic chuck 160 comprises at least one clamping electrode 132 and is controlled by a chuck power supply 166. In alternative embodiments, the substrate pedestal 124 may comprise substrate retention mechanisms such as a susceptor clamp ring, a mechanical chuck, and the like.

A lift mechanism 138 is used to lower or raise the substrate 122 onto or off of the substrate support pedestal 124. Generally, the lift mechanism 162 comprises a plurality of lift pins 130 (one lift pin is shown) that travel through respective guide holes 136.

In operation, the temperature of the substrate 122 is controlled by stabilizing the temperature of the substrate pedestal 124. In one embodiment, the substrate support pedestal 124 comprises a resistive heater 144 and a heat sink 128. The resistive heater 144 generally comprises at least one heating element 134 and is regulated by a heater power supply 168. A backside gas (e.g., helium (He)) from a gas source 156 is provided via a gas conduit 158 to channels that are formed in the pedestal surface under the substrate 122. The backside gas is used to facilitate heat transfer between the pedestal 124 and the substrate 122. During processing, the pedestal 124 may be heated by the embedded resistive heater 144 to a steady-state temperature, which in combination with the helium backside gas, facilitates uniform heating of the substrate 122. Using such thermal control, the substrate 122 may be maintained at a temperature between about 0 and 350 degrees Celsius.

A plasma stabilizer 170 is disposed in the chamber 102 above the pedestal 124. The plasma stabilizer 170 controls the spatial distribution of the charged and neutral species in the chamber 102 during processing such that a dense, stable plasma may be formed in an upper processing region of the chamber (above the plasma stabilizer 170) and a plasma with controlled characteristics in a lower processing region (between the plasma stabilizer 170 and a substrate 122 disposed on a substrate support pedestal 124).

The plasma stabilizer 170 is electrically isolated from the chamber walls 104 and the pedestal 124 and generally comprises a substantially flat plate 172 and a plurality of legs 176. The plate 172 is supported in the chamber 102 above the pedestal 124 by the legs 176. The plate 172 defines one or more openings (apertures) that define a desired open area in the surface of the plate 172. The open area of the plasma stabilizer 170 controls the quantity of ions that pass from a plasma formed in an upper process volume 178 of the process chamber 102 to a lower process volume 180 located between the plasma stabilizer 170 and the substrate 122. Thus, the open area of the plasma stabilizer 170 controls the spatial distribution of charged and neutral species of the plasma in the process chamber 102. The greater the open area, the more ions can pass through the plasma stabilizer 170. As such, the size of the apertures 174 affects the ion density in volume 180.

The apertures 174, or open area, of the plasma stabilizer 170 also affect the amount of etch by-products created on the surface of the substrate 122 from diffusing into the upper process volume 178 of the process chamber 102 where the RF power is being deposited into the plasma. The size of the aperture 174 is chosen to allow sufficient ions and radicals created in the upper process volume 178 to reach the surface of the substrate 122 and to prevent etch by-products from significantly destabilizing the deposition of RF power into the plasma.

In addition, the greater the open area, the more uniform the spatial distribution of the charged and neutral species of the plasma becomes. A larger open area also reduces the stability of the plasma. Thus, by controlling the open area of the plasma stabilizer 170, the stability of the plasma is controlled. In addition, the spatial distribution of charged and neutral species in the upper and lower processing volumes 178, 180 is controlled, thereby controlling etch uniformity and selectivity.

Figure 2:
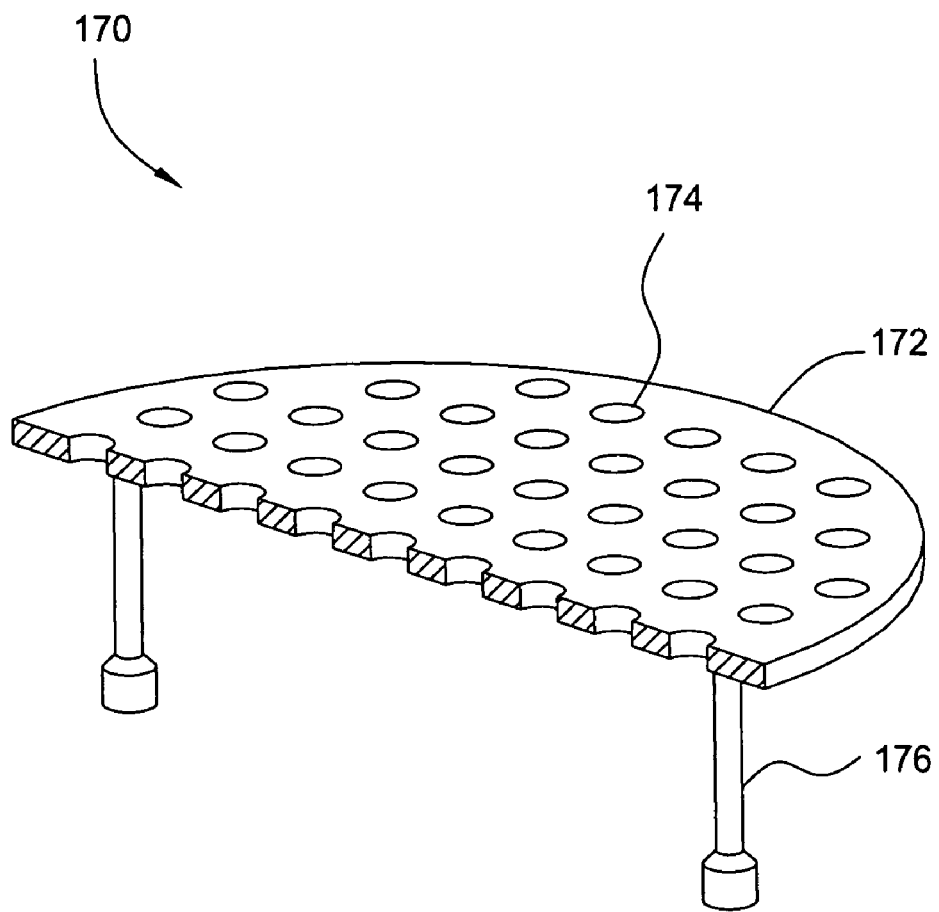
FIG. 2 is a partial perspective view of one embodiment of the plasma stabilizer of FIG. 1.

FIG. 2 depicts one specific embodiment of the plasma stabilizer 170. In this embodiment, the plasma stabilizer 170 includes a plate 172 having one or more apertures 174 and a plurality of legs 176. The plate 172 should be thick enough to be robust and thin enough to prevent the ions formed in the plasma from recombining. The plate 172 may be fabricated of a ceramic (such as alumina), quartz, anodized aluminum, or other materials compatible with process chemistries and conditions. In another embodiment, the plate 172 could comprise a screen or a mesh wherein the open area of the screen or mesh corresponds to the desired open area provided by the one or more apertures 174. Alternatively, a combination of a plate and screen or mesh may also be utilized.

The one or more apertures 174 may vary in size, spacing and geometric arrangement across the surface of the plate 172 to obtain a desired open area. The apertures 174 should be large enough to allow the plasma to sufficiently penetrate through the plate 172 and may be arranged to define an open area in the surface of the plate 172 of from about 2 percent to about 90 percent. In one embodiment, the apertures 174 are greater than 0.2 inches (0.51 cm) in diameter. In one embodiment, the one or more apertures 174 includes a plurality of approximately half-inch (1.25 cm) diameter holes arranged in a square grid pattern. It is contemplated that the holes may be arranged in other geometric or random patterns utilizing other size holes or holes of various sizes. In another embodiment, the one or more apertures 220 may comprise a single aperture 220. In one embodiment, the single aperture 220 may be substantially the same size and shape of the substrate 614 disposed on the pedestal 616.

The size, shape and patterning of the holes may vary depending upon the desired ion density in the lower process volume 180. For example, more holes of small diameter may be used to increase the radical to ion density ratio in the volume 180. In other situations, the holes may be made larger, or a number of larger holes may be interspersed with small holes to increase the ion density to radical density ratio in the volume 180. Alternatively, the larger holes may be positioned in specific areas of the plate 172 to contour the ion distribution in the volume 180. It is also contemplated that the holes are not perpendicular to the surface of the plate, i.e., they may be angled.

The height at which the plasma stabilizer 170 is supported may vary to further control the etch process. The closer the plasma stabilizer 170 is located to the ceiling 108, the smaller the upper process volume 178. A small upper process volume 178 promotes a more stable plasma. In one embodiment, the plasma stabilizer 170 is disposed approximately 1 inch (2.54 cm) from the ceiling 108. A faster etch rate may be obtained by locating the plasma stabilizer 170 closer to the pedestal 124 and, therefore, the substrate 122. Alternatively, a lower, but more controlled, etch rate may be obtained by locating the plasma stabilizer 170 farther from the pedestal 124. In one embodiment, the plasma stabilizer 170 is disposed approximately 2 inches from the pedestal 124. Alternatively, the plasma stabilizer 170 may have a contoured shape to be closer to the ceiling 108 in certain areas and farther in others, thereby shaping the upper volume 178 of the process chamber 102 in a desired manner to control the shape or contour of the plasma.

To maintain the plate 172 in a spaced-apart relationship with respect to the substrate 122, the plate 172 is supported by a plurality of legs 176 disposed on the pedestal 124. The legs 176 are generally located around an outer perimeter of the pedestal 124 or the edge ring 126 and may be fabricated of the same materials as the plate 172. In one embodiment, three legs 176 may be utilized to provide a stable support for the plasma stabilizer 170. The legs 176 generally maintain the plate 172 in a substantially parallel orientation with respect to the substrate 122 or pedestal 124. However, it is contemplated that an angled orientation may be used by having legs 176 of varied lengths.

An upper end of the legs 176 may be press fit into a corresponding hole formed in the plate 172. Alternatively, the upper end of the legs 176 may be threaded into the plate 172 or into a bracket secured to an underside of the plate 172. Other conventional fastening methods not inconsistent with processing conditions may also be used to secure the legs 176 to the plate 176.

The legs 176 may rest on the pedestal 124 or the edge ring 126. Alternatively, the legs 176 may extend into a receiving hole (not shown) formed in the pedestal 124 or edge ring 126. Other fastening methods are also contemplated for securing the plasma stabilizer 170 to the pedestal 124 or edge ring 126, such as by screwing, bolting, bonding, and the like. When secured to the edge ring 126, the plasma stabilizer 170 may be part of an easily-replaceable process kit for ease of use, maintenance, replacement, and the like. It is contemplated that the plasma stabilizer 170 may be configured to be easily retrofitted in existing process chambers.

Alternatively, the plate 172 may be supported above the pedestal 124 by other means such as by using a bracket (not shown) attached to the wall 104 or other structure within the process chamber 102—as long as the plate 172 is insulated from the ground path.

Returning to FIG. 1, one or more process gases are provided to the process chamber 102 from a gas panel 120. The process gases are typically supplied through one or more inlets 116 (e.g., openings, injectors, and the like) located above the substrate pedestal 124. In the embodiment depicted in FIG. 1, the process gases are provided to the inlets 116 using an annular gas channel 118. The gas channel 118 may be formed in the wall 104 or in gas rings (as shown) that are coupled to the wall 104. During an etch process, the process gases are ignited into a plasma by applying power from the plasma source 112 to the antenna 110.

The pressure in the chamber 102 is controlled using a throttle valve 162 and a vacuum pump 164. The temperature of the wall 104 may be controlled using liquid-containing conduits (not shown) that run through the wall 104. Typically, the chamber wall 104 is formed from a metal (e.g., aluminum, stainless steel, and the like) and is coupled to an electrical ground 106. The process chamber 102 also comprises conventional systems for process control, internal diagnostic, end point detection, and the like. Such systems are collectively shown as support systems 154.

The controller 146 comprises a central processing unit (CPU) 644, a memory 148, and support circuits 152 for the CPU 150 and facilitates control of the components of the process chamber 102 and, as such, of the etch process, as discussed below in further detail. The controller 146 may be one of any form of general-purpose computer processor that can be used in an industrial setting for controlling various chambers and sub-processors. The memory, or computer-readable medium, 642 of the CPU 150 may be one or more of readily available memory such as random access memory (RAM), read only memory (ROM), floppy disk, hard disk, or any other form of digital storage, local or remote. The support circuits 152 are coupled to the CPU 150 for supporting the processor in a conventional manner. These circuits include cache, power supplies, clock circuits, input/output circuitry and subsystems, and the like. The inventive method is generally stored in the memory 148 as a software routine. Alternatively, such software routine may also be stored and/or executed by a second CPU (not shown) that is remotely located from the hardware being controlled by the CPU 150.

Figure 3:
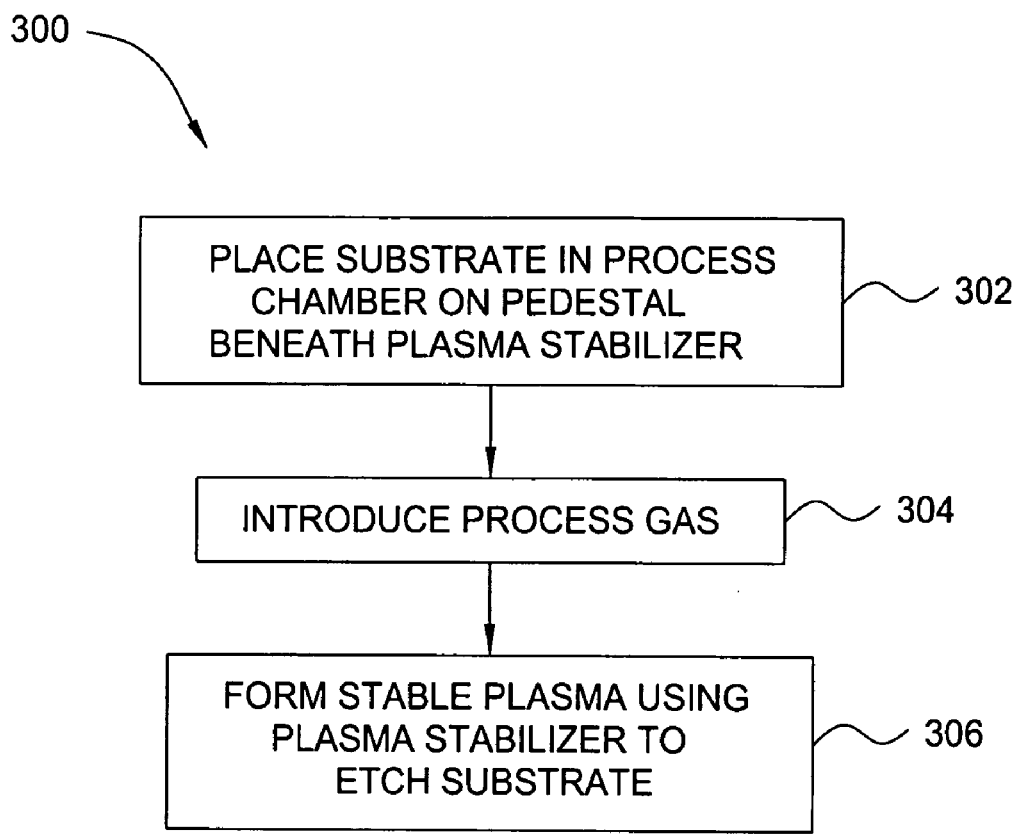
FIG. 3 is a flow chart of a method of etching tungsten.

One exemplary method 300 for using the plasma stabilizer 170 to etch a layer of tungsten disposed on a substrate is depicted in the flow chart of FIG. 3 and illustrated with respect to FIG. 1. The method 300 begins at step 302 where a substrate 122 is placed in a process chamber 102 on a support pedestal 124 beneath a plasma stabilizer 170. The substrate 122 is generally a semiconductor substrate having an at least partially exposed layer of tungsten disposed thereon. A bias power of from about 0 to about 200 W may be applied by the bias power source 140 to the electrostatic chuck 160 to assist in retaining the substrate 124 in place on the pedestal 124 during processing. In one embodiment, about 50 W of bias power is applied. Although tungsten is described as one example of a material that can be beneficially etched using the plasma stabilizer 170 of the present invention, other materials, especially metals, can also be beneficially etched using the stabilizer 170 and the quasi-remote plasma generated thereby.

At step 304, a process gas is introduced into the process chamber 102. The process gas may be sulfur hexafluoride ($SF_6$) and may also include nitrogen ($N_2$). The $SF_6$ may be provided at a rate of from about 20 to about 300 standard cubic centimeters per minute (sccm). In one embodiment, $SF_6$ is provided at a rate of about 48 sccm. The $N_2$ may be provided at a rate of from about 0 to about 30 sccm. In one embodiment, the $N_2$ is provided at a rate of about 12 sccm. Other suitable process gases for etching include chlorine ($Cl_2$), nitrogen trifluoride ($NF_3$), carbon tetrafluoride ($CF_4$), hydrogen chloride (HCl), and the like. These process gases may be provided in similar ranges as the $SF_6$ and may also be part of a gaseous compound or introduced along with other process gases, such as $N_2$. The pressure inside the process chamber 102 is generally controlled to be within the range of from about 3 to about 50 mTorr. In one embodiment, the pressure inside the process chamber 102 is controlled to be about 10 mTorr.

At step 306, a plasma is formed in the chamber 102 by applying RF power from the plasma power source 112 to the antenna 110. Power is typically provided in a range of from about 100 to about 1200 W. In one embodiment, RF power at a power level of about 600 W is applied to the antenna 110 at a frequency of about 13.56 MHz.

When the plasma is formed during step 306, the plasma stabilizer 170 provides for a dense, stable plasma in the upper process volume 178. Thus, enabling the substrate 122 to be etched at lower pressures and power requirements. Specifically, plasma stability measurements taken over a blanket tungsten substrate in etch chambers not containing the plasma stabilizer 170 have revealed that, over a range of pressures of from about 0 to about 60 mTorr, RF power of about 1500 W and higher was required to maintain a stable plasma. At pressures in the range of from about 10 to about 30 mTorr, significantly higher power was required to stabilize the plasma, and in some cases, the plasma was not able to be stabilized even at power levels in excess of 3000 W. A similar set of plasma stability measurements were taken in the same chamber, but with a plasma stabilizer 170 installed. Using the plasma stabilizer 170, the plasma was found to be stable over a range of pressures from about 0 to about 60 mTorr at about 500 W of RF power. Thus, use of the plasma stabilizer 170 widens the process window, enabling etch processes at pressures and power levels previously unattainable. Furthermore, the more stable plasma, in combination with the control of the spatial distribution of the charged and neutral species in the upper and lower processing volumes 178, 180, improves etch uniformity and selectivity.

For other plasma processing applications, by-products created by the processing of the substrate may detrimentally affect the process results. For example, when etching chrome using a chlorine and oxygen plasma, the chrome-oxy-chloride etch by-product generated by the substrate can become dissociated by the plasma, which then inhibits the etching process. In this application, use of the plasma stabilizer prevents the etch by-products from traveling to the region where the RF power is being deposited and thereby improves the uniformity and selectivity of the chrome etch process.

Similar improvements in the stability and uniformity of other plasma processing applications such as CVD, PVD, gate nitridation, and plasma implant could be achieved by using a plasma stabilizer structure as described above.

While the foregoing is directed to embodiments of the present invention, other and further embodiments of the invention may be devised without departing from the basic scope thereof, and the scope thereof is determined by the claims that follow.

The invention claimed is:

1. An apparatus for plasma processing a substrate, comprising:
 a process chamber having an internal volume defined by a chamber ceiling and chamber walls;
 a substrate support pedestal disposed in the internal volume;
 an RF power source for forming a plasma within the internal volume of the process chamber;
 a plasma stabilizer disposed in the internal volume of the process chamber above the pedestal and spaced apart from the chamber ceiling, the plasma stabilizer having a diameter greater than a diameter of the pedestal and separating a first processing region above the plasma stabilizer wherein the plasma is maintained from a second processing region below the plasma stabilizer and above the pedestal, the plasma stabilizer adapted to control the spatial distribution of charged and neutral species of the plasma, wherein the plasma stabilizer further comprises:
 a member electrically isolated from the chamber;
 a plurality of apertures formed through the member; and
 a plurality of support legs supporting the member above the pedestal; and
 an edge ring disposed about a perimeter of an upper surface of the substrate support pedestal and having the plurality of support legs extending therefrom.

2. The apparatus of claim 1, wherein the RF power source is inductively coupled to the process chamber.

3. The apparatus of claim 1, wherein the plasma stabilizer is disposed about 1.25 cm below a ceiling of the process chamber.

4. The apparatus of claim 1, wherein the apertures are about 1.25 cm in diameter.

5. The apparatus of claim 1, wherein the member is non-parallel to the upper surface of the pedestal.

6. The apparatus of claim 1, wherein the apertures have a hole size, shape, position, and distribution over the surface of the member to define an ion density to radical density ratio proximate the substrate.

7. The apparatus of claim 1, wherein the legs support the member in a substantially parallel, spaced apart relation with respect to the pedestal.

8. The apparatus of claim 1, wherein the member is fabricated from at least one of ceramic, quartz, or anodized aluminum.

9. The apparatus of claim 1, wherein the plasma stabilizer is electrically isolated from ground.

10. The apparatus of claim 1, wherein a plasma is formed having an ion density to radical density ratio in the first processing region above the plasma stabilizer that is different from the ion density to radical density in the second processing region below the stabilizer.

11. The apparatus of claim 10, wherein the ion density to radical density ratio is lower in the second processing region.

12. The apparatus of claim 1, wherein ends of the legs do not extend beyond the diameter of the member.

13. The apparatus of claim 1, wherein the member is fabricated from aluminum.

14. The apparatus of claim 1, wherein the plurality of apertures further comprise:
 a first group of apertures having a first diameter; and
 a second group of apertures having a second diameter that is different than the first diameter.

15. The apparatus of claim 1, wherein the plurality of apertures further comprise:
 a first group of apertures arranged in a first aperture density; and
 a second group of apertures arranged in a second aperture density that is different than the first aperture density.

16. An apparatus for plasma etching, comprising:
 a process chamber having an internal volume defined by a chamber ceiling and chamber walls;
 a substrate support pedestal disposed in the internal volume of the process chamber;
 an edge ring disposed about a perimeter of an upper surface of the substrate support pedestal;
 an RF power source for forming a plasma within the internal volume of the process chamber; and
 means for vertically controlling the spatial distribution of charged and neutral species of the plasma, wherein the means is disposed within the internal volume of the process chamber spaced away from the chamber lid, wherein the means further comprises:
 a member electrically isolated from the chamber, the member having a diameter greater than a diameter of the edge ring;
 a plurality of apertures formed through the member; and
 a plurality of support legs supporting the member above the pedestal, wherein ends of each leg are disposed inward of a perimeter of the member, the plurality of support legs extending from the edge ring.

17. The apparatus of claim 16, wherein the means for controlling the spatial distribution of charged and neutral species of the plasma comprises a plasma stabilizer is spaced apart from a chamber body of the process chamber and the pedestal.

18. The apparatus of claim 17, wherein the plasma stabilizer separates a portion of the internal volume above the pedestal into a first processing region above the plasma stabilizer and a second processing region below the plasma stabilizer.

19. The apparatus of claim 16, wherein the plurality of apertures further comprise:
- a first group of apertures having a first diameter; and
- a second group of apertures having a second diameter that is different than the first diameter.

20. The apparatus of claim 16, wherein the plurality of apertures further comprise:
- a first group of apertures have at least one of a first diameter or are arranged in a first aperture density; and
- a second group of apertures have at least one of a second diameter or are arranged in a second aperture density that is different than at least one of the first aperture density or the first diameter.

21. The apparatus of claim 16, wherein the plurality of apertures further comprise:
- a first group of apertures arranged in a first aperture density; and
- a second group of apertures arranged in a second aperture density that is different than the first aperture density.

22. An apparatus for plasma processing a substrate, comprising:
- a chamber body;
- a substrate support pedestal disposed in an internal volume of the chamber body;
- an RF power source for maintaining a plasma within the internal volume of the chamber body; and
- a plasma stabilizer spaced from the chamber body and separating a region of the internal volume above the pedestal into a first and second processing regions, wherein the plasma stabilizer vertically controls the spatial distribution of charged and neutral species of the plasma between the first and second processing regions, the plasma stabilizer having a diameter greater than a diameter of the pedestal;
- a plurality of support legs supporting the plasma stabilizer above the substrate support pedestal; and
- an edge ring disposed about a perimeter of an upper surface of the substrate support pedestal and having the plurality of support legs extending therefrom, wherein the legs do not extend radially beyond a perimeter of the plasma stabilizer.

23. The apparatus of claim 22, wherein the plasma stabilizer further comprises:
- a member electrically isolated from the chamber; and
- a plurality of apertures formed through the member.

24. The apparatus of claim 22, wherein the member is non-parallel to the upper surface of the substrate support pedestal.

25. The apparatus claim 22, wherein the legs support the member in a substantially parallel, spaced apart relation with respect to the pedestal, and wherein the legs do not extend beyond the diameter of the plasma stabilizer.

26. The apparatus of claim 22, wherein the plasma stabilizer is fabricated from at least one of ceramic, quartz, or anodized aluminum.

27. The apparatus of claim 22, wherein the plasma stabilizer is electrically isolated from ground.

* * * * *